United States Patent
Bhardwaj et al.

(10) Patent No.: US 6,261,962 B1
(45) Date of Patent: *Jul. 17, 2001

(54) METHOD OF SURFACE TREATMENT OF SEMICONDUCTOR SUBSTRATES

(75) Inventors: Jyoti Kiron Bhardwaj, Bristol; Huma Ashraf, Newport; Babak Khamsehpour, Coventry; Janet Hopkins, Crickhowell; Alan Michael Hynes, Cardiff; Martin Edward Ryan, Crickhowell; David Mark Haynes, Risca, all of (GB)

(73) Assignee: Surface Technology Systems Limited, Newport (GB)

( * ) Notice: Subject to any disclaimer, the term of this patent is extended or adjusted under 35 U.S.C. 154(b) by 0 days.

This patent is subject to a terminal disclaimer.

(21) Appl. No.: 08/904,954

(22) Filed: Aug. 1, 1997

(30) Foreign Application Priority Data

Aug. 1, 1996 (GB) .................................................. 9616225

(51) Int. Cl.$^7$ ................................................ H01L 21/311
(52) U.S. Cl. ............................................ 438/702; 438/700
(58) Field of Search ................................ 156/643, 646.1; 438/695, 694, 738, 737, 735, 706, 707, 710, 712, 714, 715, 718, 719, 726, 696, 700, 701, 702, 703

(56) References Cited

U.S. PATENT DOCUMENTS

| | | |
|---|---|---|
| 4,533,430 | 8/1985 | Bower . |
| 4,599,135 | 7/1986 | Tsunekawa et al. . |
| 4,635,090 | 1/1987 | Tamaki et al. . |
| 4,707,218 | 11/1987 | Giammarco et al. . |
| 4,784,720 | 11/1988 | Douglas . |
| 4,795,529 | 1/1989 | Kawasaki et al. . |
| 4,832,788 | 5/1989 | Nemiroff . |
| 4,855,017 | * 8/1989 | Douglas . |
| 4,985,114 | 1/1991 | Okudaira et al. . |
| 5,068,202 | 11/1991 | Crotti et al. . |
| 5,074,955 | * 12/1991 | Henry et al. . |
| 5,079,178 | 1/1992 | Chouan et al. . |
| 5,368,685 | 11/1994 | Kumihashi et al. . |
| 5,474,650 | 12/1995 | Kumihashi et al. . |
| 5,478,437 | 12/1995 | Hashemi et al. . |
| 5,501,893 | 3/1996 | Laermer et al. . |
| 5,605,600 | 2/1997 | Muller et al. . |
| 6,051,503 | * 4/2000 | Bhardwaj et al. . |

FOREIGN PATENT DOCUMENTS

| | | |
|---|---|---|
| 0 160 220 A1 | 11/1985 | (EP) . |
| 0 246 514 A2 | 11/1987 | (EP) . |
| 0 350 997 A2 | 1/1990 | (EP) . |
| 0 363 982 A2 | 4/1990 | (EP) . |
| 0 383 570 A2 | 8/1990 | (EP) . |
| 0 482 519 | 10/1991 | (EP) . |
| 0 482-519 A1 | 4/1992 | (EP) . |
| 0 536 968 A2 | 4/1993 | (EP) . |
| 0 562 464 A1 | 9/1993 | (EP) . |
| 62-136066 | 6/1987 | (JP) . |
| 3-126222 | 5/1991 | (JP) . |
| 3-129820 | 6/1991 | (JP) . |
| 6-12767 | 2/1994 | (JP) . |
| WO 89/01701 | 2/1989 | (WO) . |
| WO 94/14187 | 6/1994 | (WO) . |

OTHER PUBLICATIONS

P. Bruice, Organic Chemistry, 1995, Prentice Hall, p. G–9.*
Law et al., "Alkane based plasma etching of GaAs", 1991, Journal of Vacuum Science & Technology B, pp. 1449–1455.*
K. Tsujimoto et al., "A New Side Wall Protection Technique in Microwave Plasma Etching Using a Chopping Method", 1986, Extended Abstracts of the 18th Conference on Solid State Devices and Materials, Tokyo, pp. 229–232.*
M. Law et al. 8257b Journal of Vacuum Science & Technology B 9 (1991) May/Jun., No. 3, New York, US Alkane based plasma etching of GaAs.
Patent Abstracts of Japan, Publication No.: 58147032; Publication Date: Sep. 1, 1983; Inventor: Nakayama Ryozo: "Preparation of Semiconductor Device".
Patent Abstracts of Japan, Publication No.: 02061069; Publication Date: Mar. 1, 1990; Inventor: Kawano Atsushi: "Formation of Coating Film".
L.M. Ephrath, "Selective Etching of Silicon Dioxide Using Reactive Ion Etching with CF4–H2", J. Electrochem, Soc.: Solid–State Science and Technology, Aug. 1979, pp. 1419–1421.
D.W. Hess, "Plasma Etch Chemistry of Aluminum and Aluminum Alloy Films", Plasma Chemistry and Plasma Processing, vol. 2, No. 2, 1982, pp. 141–155.

* cited by examiner

Primary Examiner—Charles Bowers
Assistant Examiner—Evan Pert
(74) Attorney, Agent, or Firm—Jones Volentine, PLLC

(57) ABSTRACT

A sidewall passivation layer is deposited on an etched feature in a semiconductor substrate with a hydrocarbon deposition gas by introducing $H_2$, determining certain mixture percentages for the hydrocarbon gas/$H_2$ mix at which the etch rate for the substrate peaks, the etch rate begins to rise from a generally steady state, and/or the etch rate falls to zero, and then maintaining the mixture percentage within a selected range. Where the hydrocarbon gas/$H_2$ mix is maintained at a percentage between the steady-state etch rate percentage and the peak etch rate percentage, then relatively high ion energies are used. Where the hydrocarbon gas/$H_2$ mix is maintained at a percentage between the peak etch rate percentage and the percentage where the etch rate falls to zero, then relatively low ion energies are used. High aspect-ratio features in a semiconductor substrate can be produced by performing alternating etching and depositing a passivation layer on the substrate, where the deposition is performed according to the above-described deposition process.

23 Claims, 13 Drawing Sheets

Fig. 19A

Etch Step

| Eflow (sccm) SF₆ | Time (s) | Pressure (mTorr) | CoilP (W) | PlatenP(W) |
|---|---|---|---|---|
| 50 → 130 ⓡ | 13 | 25 → 35 ⓡ | 600 | 12 → 10 ⓡ |

Dep. Step

| Pflow (sccm) C₄F₈ | Time (s) | Pressure (mTorr) | CoilP (W) | PlatenP(W) |
|---|---|---|---|---|
| 170 → 85 ⓡ | 7 | 38 → 21 ⓡ | 600 | 0 |

Comments

(Figure 14) ⓡ = Parameter Ramped

Process Time = 8 mins
Etch Depth = 23 μm, Critical Dimension = 3 μm
Note Ramp only during first 10 cycles

Fig. 19B

Etch Step

| Eflow (sccm) SF₆ | Time (s) | Pressure (mTorr) | CoilP (W) | PlatenP(W) |
|---|---|---|---|---|
| 80 | 12 | 35 → 25 ⓡ | 600 | 10 → 12 ⓡ |

Dep. Step

| Pflow (sccm) C₄F₈ | Time (s) | Pressure (mTorr) | CoilP (W) | PlatenP(W) |
|---|---|---|---|---|
| 52 | 7 | 20 → 15 ⓡ | 600 | 0 → 5 ⓡ |

Comments

(Figure 18) ⓡ = Parameter Ramped

Process Time = 90 mins
Etch Depth ~250 μm, Critical Dimension up to 12 μm

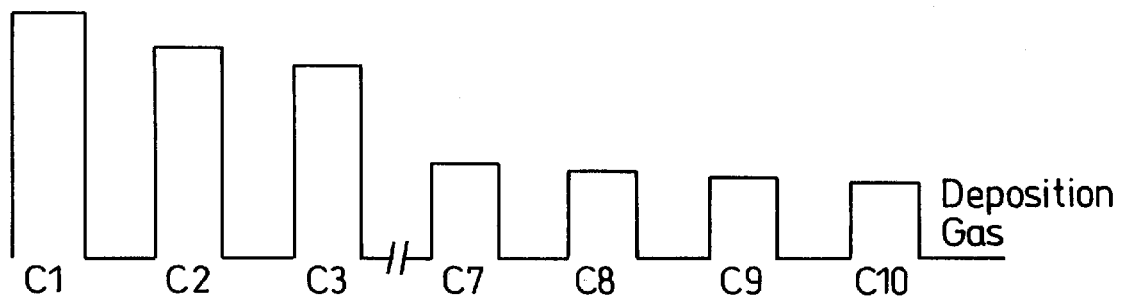
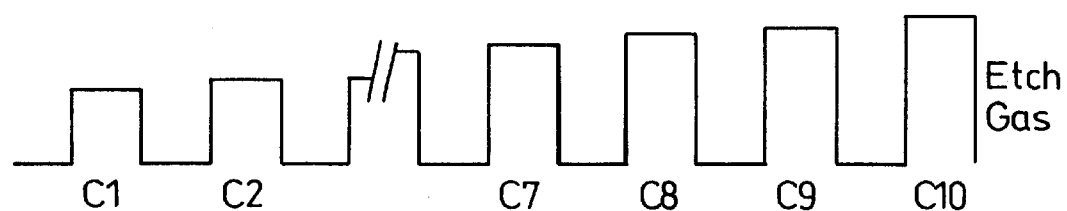
Fig. 20
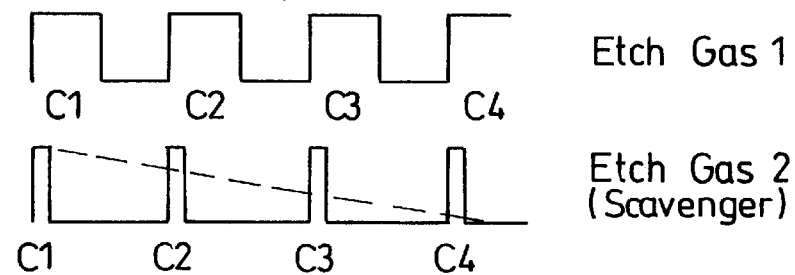
Fig. 21

METHOD OF SURFACE TREATMENT OF SEMICONDUCTOR SUBSTRATES

BACKGROUND OF THE INVENTION

1. Field of the Invention

This invention relates to methods of treatment for semiconductor substrates and in particular, but not exclusively, to methods of depositing a sidewall passivation layer on etched features and methods of etching such features including the passivation method.

2. Description of the Background Art

It is known to etch anisotropically trenches or recesses in silicon using methods which combine etching and deposition. The intention is to generate an anisotropic etch, whilst protecting the sidewalls of the trench or recess formed by laying down a passivation layer.

Such methods are for example shown in U.S. Pat. No. 4,579,623, EP-A-0497023, EP-A-0200951, WO-A-94114187 and U.S. Pat. No. 4,985,114. These all describe either using a mixture of deposition and etching gases or alternate etching and deposition steps. The general perception is that mixing the gases is less effective because the two processes tend to be self cancelling and indeed the prejudice is towards completely alternate steps.

Other approaches are described in EP-A-0383570, U.S. Pat. No. 4,943,344 and U.S. Pat. No. 4,992,136. All of these seek to maintain the substrate at a low temperature and at first, somewhat unusually, use bursts of high energy ions during etching to remove unwanted deposits from the sidewalls.

The continuous trend in semiconductor manufacture is for features of ever increasing aspect ratio, whence the sidewall profile and the surface roughness on the sidewalls, becomes more significant the smaller the width of the feature. Current proposals tend to produce a characteristically notched sidewall with poor CD control, reentrant sidewall profile as well as rough sidewalls and/or bases to the formations and depending on the process being run. The manifestation of these various problems depends on the application and the respective processing requirements; silicon exposed area (unmasked substrate area), etch depth, aspect ratio, sidewall profile, substrate topography.

SUMMARY OF THE INVENTION

The method of this invention, in at least some embodiments, addresses or reduces the problems described above.

One aspect the invention consists of a method of depositing a sidewall passivation layer on an etched feature in a semiconductor substrate, comprising placing the substrate in vacuum chamber, striking a plasma and introducing a hydrocarbon deposition gas to deposit a carbon or hydrocarbon layer.

This is in contrast to previous proposals which have deposited layers of the form $CF_x$.

In a preferred arrangement the deposition gas includes $H_2$, for example $H_2$ may be introduced with the deposition gas and the method includes determining the percentage of hydrocarbon gas in $H_2$ at which at least two of the following occurs:

(a) the etch rate begins to rise from a generally steady state
(b) the etch rate peaks
(c) the etch rate falls to zero and subsequently performing the method of claim 1 with a hydrocarbon gas/$H_2$ mix which lies between a pair of (a), (b) or (c). In another preferred arrangement the deposition gas includes O,N or F elements and the deposited layer may be self biased in one arrangement to a relatively low voltage (to allow the ions to become accelerated to energies of several eV($\leq 20$ eV)). In this case a mix percentage between (b) and (c) may be used. In another arrangement the ion energies are as high as several hundred eV in which case a mix percentage between (a) and (b) may be used.

The invention further consists of a method of etching a feature in a semiconductor substrate including alternatively etching and depositing a passivation layer wherein the deposition step is as defined above.

The prior art teaches the benefit of totally segregated etch and deposition steps. Alternatives to this, which address some of the aforementioned limitations are presented. The etching and deposition steps may overlap and etching and deposition gases may be mixed.

The method may include pumping out the chamber between etching akd deposition and/or between deposition and etching, in which case the pump out may continue until $$\frac{Ppa}{Ppa + Ppb} < x$$

wherein Ppa is the partial pressure of the gas (A) used in the preceding step,

Ppb is the partial pressure of the gas (B) to be used in the subsequent step, and x is the percentage at which the process rate of the process associated with gas (A) drops off from an essentially steady state.

Depending on the precise process requirements and problems encountered with the prior art, the gases may be continuously or abruptly variable and indeed one or more of the following parameters: the gas flows rates, chamber pressure, plasma power, substrate bias and etching/deposition rate may vary periodically with the time for example as a sinusoidal, square or sawtooth wave form or a combination of these. For example the deposition and etching gases may be supplied so that their flow rates are sinusoidal and out of phase. The amplitude of any of these parameters may be variable within cycles and as between cycles. Benefits of the various approaches are given with typical processing conditions for a number of exemplary applications. In the particular case of CD (critical dimension) loss, initial 'notch' reduction is essential. When the silicon exposed area is relatively low ($\leq 20\%$) and the corresponding etch rate is high, one solution that is preferred is that the deposition rate is enhanced and/or the etch is reduced during at least the first cycle and in appropriate circumstances in the first few cycles for example in the second to fourth cycles.

Other advantageous features of the method are that the etch and/or deposition steps may have periods of less than 7.5 seconds or even 5 seconds to reduce surface roughness; the etch gas may be $CF_x$ and may include one or more high atomic mass halides to reduce spontaneous etch; and the chamber pressure may be reduced and/or the flow rate increased during deposition particularly for shallow high aspect ratio etching where it may be accompanied by increased self bias.

The substrate may rest freely on a support in the chamber when back cooling would be an issue. Alternatively the substrate may be clamped and its temperature may be controlled, to lie, for example, in the range from −100° C. to 100° C. The temperature of the chamber can also advantageously be controlled to the same temperature range as the wafer to reduce condensation on the chamber or its furniture.

The substrate may be GaAs and in this case the etch gas may particularly preferably be one or a combination of $Cl_2$, $BCl_3$, $SiCl_4$, $SiCl_2H_2$, $CH_xCl_y$, $C_xCl_y$, or $CH_x$ with or without H or an inert gas. $Cl_2$ is particularly preferred. The deposition gas may be one or a combination of $CH_x$, $CH_xCl_y$, or $C_xCl_y$, with or without H, or an inert gas. $CH_4$ or $CH_2Cl_2$ are particularly preferred.

Although the invention has been defined above it is to be understood that it includes any inventive combination of the features set out above or in the following description.

BRIEF DESCRIPTION OF THE DRAWINGS

The invention may be performed in various ways and a specific embodiment will now be described by way of example, with reference to the accompanying drawings in which:

FIGS. 19(A) and 19(B) are tables setting out the process conditions used for the trenches shown in FIGS. 14 and 18 respectively;

FIG. 20 is a diagram showing the synchronisation of Deposition and Etch gas during the initial cycles of the Applicants' process; and FIG. 21 is a diagram showing an alternative approach to FIG. 20 utilising a scavenger gas.

DETAILED DESCRIPTION OF THE PREFERRED EMBODIMENTS

Figure 1:
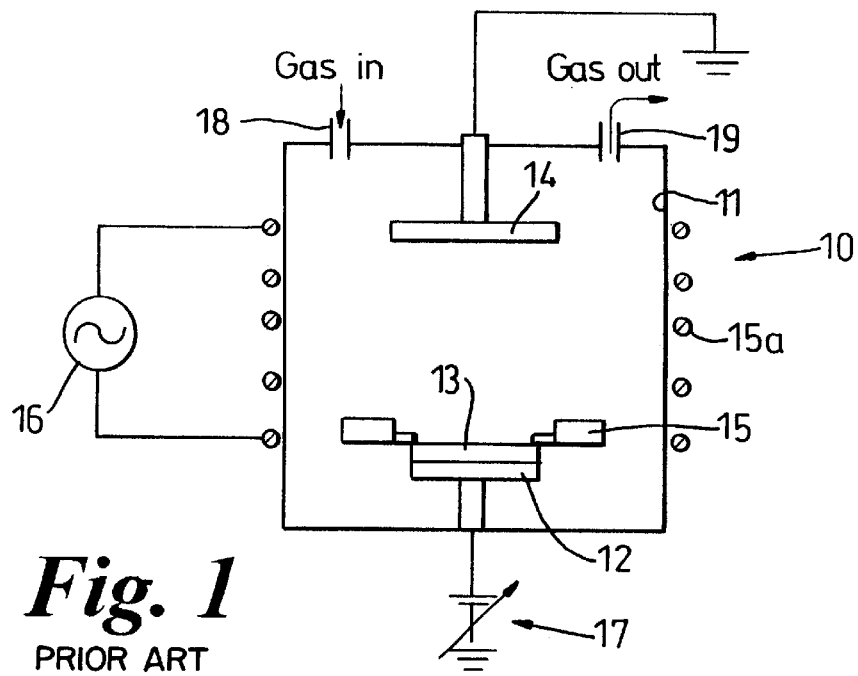
FIG. 1 is a schematic view of a reactor for processing semiconductors.

FIG. 1 illustrates schematically a prior art reactor chamber 10, which is suitable for use both in reactive ion etching and chemical vapour deposition. Typically a vacuum chamber 11 incorporates a support electrode 12 for receiving a semiconductor wafer 13 and a further spaced electrode 14. The wafer 13 is pressed against the support 12 by a clamp 15 and is usually cooled, by backside cooling means (not shown).

The chamber 11 is surrounded by a coil 15a and fed by a RF source 16 which is used to induce a plasma in the chamber 11 between the electrodes 12 and 14. Alternatively a microwave power supply may be used to create the plasma. In both cases there is a need to create a plasma bias, which can be either RF or DC and can be connected to the support electrode 12 so as to influence the passage of ions from the plasma down on to the wafer 13. An example of such an adjustable bias means is indicated at 17. The chamber is provided with a gas inlet port 18 through which deposition or etched gases can be introduced and an exhaust port 19 for the removal of gaseous process products and any excess process gas. The operation of such a reactor in either the RIE or CVD modes is well understood in the art.

Figure 2:
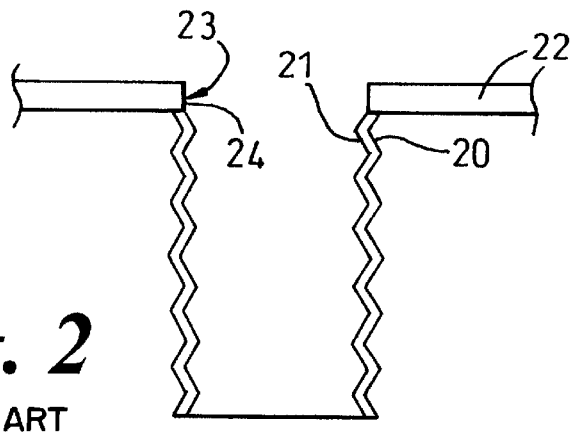
FIG. 2 is a schematic illustration of a trench formed by a prior art method.

When etching trenches, etches, vias or other formations on the surface of a semiconductor wafer or substrates, the usual practice is to deposit a photo-resist mask with openings revealing portions of the substrate. Etched gases are introduced into the chamber and a number of steps are then taken to attempt to ensure that the etching process is anisotropic in a downward direction so that there is as little etching of the sidewalls of the formation as possible. For a variety of reasons it is difficult in practice to achieve true anisotropic etching and various attempts are made to deposit passivating materials onto the sidewalls so that the material can be sacrificially etched. The most successful to date of such systems is probably that described in WO-A-94114187 and this approach is schematically illustrated in FIG. 2. The process described in that document uses sequential and discrete etch and deposition steps so that after the first etched step the sidewalls are undercut as shown at 20 and this undercut is then protected by a deposited passivation layer 21. As can be seen from FIG. 2 this arrangement produces a rough sidewall and as the etched steps increase, or indeed the aspect ratio increases, there can be bowing or re-entrant notching in the profile. The prior art documents describe the deposition of $CF_x$ passivation layers.

The Applicants propose a series of improvements to such processes to enable the formation of more smooth walled formations and particularly better quality deep and/or high aspect ratio formations. For convenience the description will therefore be divided into sections.

1. Passivation

As has been mentioned above previous proposals deposit a passivation layer of the form $CF_x$. The Applicants propose passivating the sidewalls with carbon or hydrocarbon layers which will provide significantly higher bond energies, particularly if deposited under high self- bias so that the graphitic phase is at least partially removed.

If these films or layers are also desirably deposited at high self biases eg. 20 eV upwards and preferably over 100 eV, there is an additional significant advantage when it comes to high aspect ratio formations, because the high self-bias ensures that the transport of the depositing material down to the base of the formation being etched is enhanced to prevent re-entrant sidewall etching. This transportation effect can also be improved by progressively reducing the chamber pressure and/or increasing the gas flow rate, so as to reduce the residence time. In some arrangements it may be desirable to drive the deposition to such an extent that a positively tapered, or v-shaped formation is achieved. In the particular case of shallow (<20 µm) high aspect ratio trenches, the feature opening size (or critical dimension) can be in the <0.5 µm range.

The hydrocarbon (H—C) films formed by this passivation have significant advantages over the prior art fluorocarbon films.

The H—C films can for example be readily removed after etching processing has been completed by dry ashing (oxygen plasma) treatment. This can be particularly important in the formation of MEMS (micro-electro-mechanical systems) where wet processing can result in sticking of resonant structures which are separated by high aspect trenches. In other applications, eg. optical or biomedical devices, it can be essential to remove completely the side wall layer.

The H—C films may be deposited from a wide range of H—C precursors (eg. $CH_4$, $C_2H_4$, $C_3H_6$, $C_4H_8$, $C_2H_2$. etc. including high molecular weight aromatic H—C's). These may be mixed with noble gases and/or $H_2$. An oxygen source gas can also be added (eg CO, $CO_2$, $O_2$ etc.) can be used to control the phase balance of the film during deposition. The oxygen will tend to remove the graphitic phase ($sp^2$) of the carbon leaving the harder ($sp^3$) phase. Thus, the proportion of oxygen present will affect the characteristics of the film or layer, which is finally deposited.

As has been mentioned above $H_2$ can be mixed in with the H—C precursor. $H_2$ will preferentially etch silicon and if the proportions are correctly selected, it is possible to achieve side wall passivation, whilst continuing the etching of the base of the hole during passivation phase.

Figure 4:
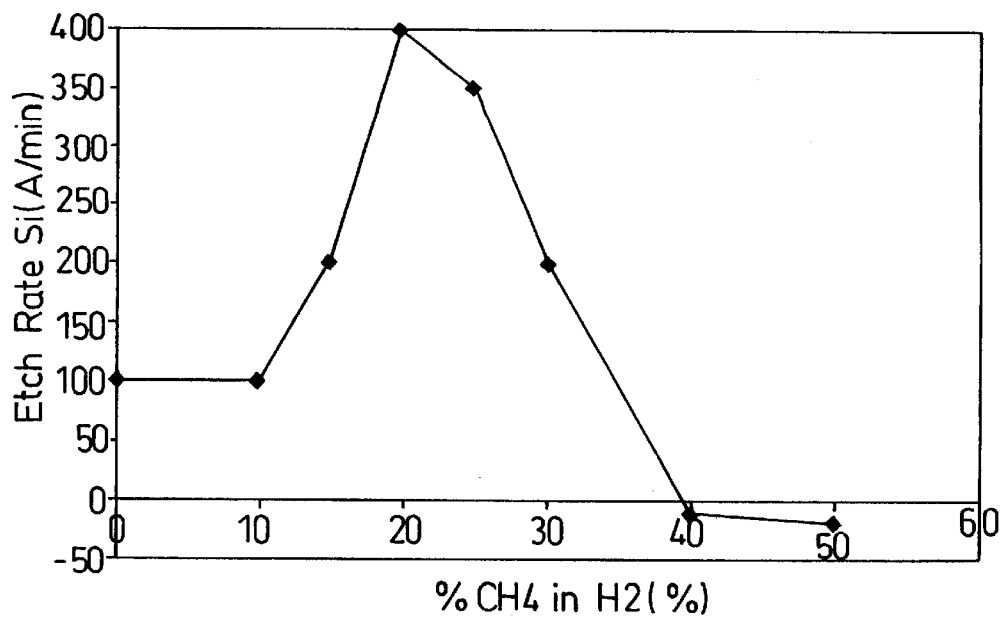
FIG. 4 is a plot of etch rate of silicon against the percentage of $CH_4$ in $H_2$.

The preferred procedure for this is to mix the selected H—C precursor (eg. $CH_4$) with $H_2$ and process a mask patterned silicon surface with the mixture in the apparatus, which is to be used for the proposed etch procedure. The silicon etch rate is plotted as a function of $CH_4$ concentration in $H_2$ and an example of such a plot is shown in FIG. 4. It will be noted that the etch rate increases from an initial steady state with increasing percentage of $CH_4$ to a peak before decreasing to zero.

It is believed the graph illustrates the following mechanisms taking place. In the initial steady state portion the etch is essentially dominated by the action of $H_2$ to form SiHx reaction products. At around 10% of $CH_4$ in $H_2$, the $CH_4$ etching of the substrate becomes significant (by forming Si(CHx)y products) and the etch rate increases. Deposition of a hydrocarbon layer is taking place throughout although due to the etching there is no net deposition on this part of the graph. Eventually, the deposition begins to dominate the etching process until at around 38% for $CH_4$, net deposition occurs.

It has been determined that these varying characteristics can be utilized in two different ways. Under high self bias or if there is high mean ion energy, eg. >100 ev, the layer or coating laid down is relatively hard because the reduced graphitic phase and the process can be operated in the rising portion of the etch rate graph, because the coating is much more resistant to etching, than the silicon substrate. It is thus possible to etch the silicon throughout the deposition phase. Selectivities exceeding 100:1 to mask or resist are readily achieved. It should particularly be noted that, whilst there is a significant removal of the graphitic phase due to ion bombardment of the mask, the high directionality of the ions means that the side wall coating is relatively untouched.

The process can also be operated at low mean ion energies either with a H—C precursor alone or with $H_2$ dilution. In that latter case it is preferred that the process is operated in the descending part of the etch graph. ie. for $CH_4$ at a percentage >18% but <38% when net deposition occurs. Typically the range for $CH_4$ would be 18% to 30%.

Figure 5:
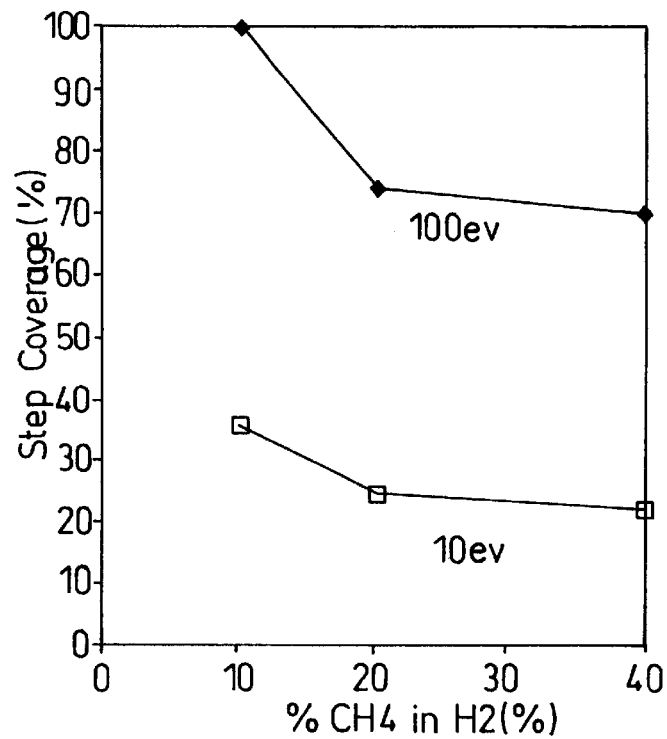
FIG. 5 is a plot of step coverage against the percentage of $CH_4$ in $H_2$ for different mean ion energies.

The low values of mean ion energy during the polymer deposition are believed to be beneficial in allowing high mask selectivies. Under these lower rf bias conditions, the selectivity increases to infinity over a wide passivation deposition window. So if high selectivity is required, the low mean ion energy approach offers advantages. FIG. 5 illustrates the step coverage (side wall deposition measured at 50% of the step height versus surface deposition) for H—C films using $CH_4$ and $H_2$ under a range of conditions including the two embodiments described above. FIG. 5 shows that high ion energies increase the step coverage, but even with low bias conditions, there is sufficient passivation to protect against lateral etching. Further, in this latter case the higher deposition rate serves further to enhance the mask selectivity. The deposition rate at low ion energies is a factor of two greater over the 100 ev case.

It will thus be appreciated that by using these techniques the user can essentially select the combination of etch rate and selectivity, which most suits his proposed structure. Further the enhancement of mask selectivity can be used to either increase the etch rate and/or reduce the notching.

Figure 6:
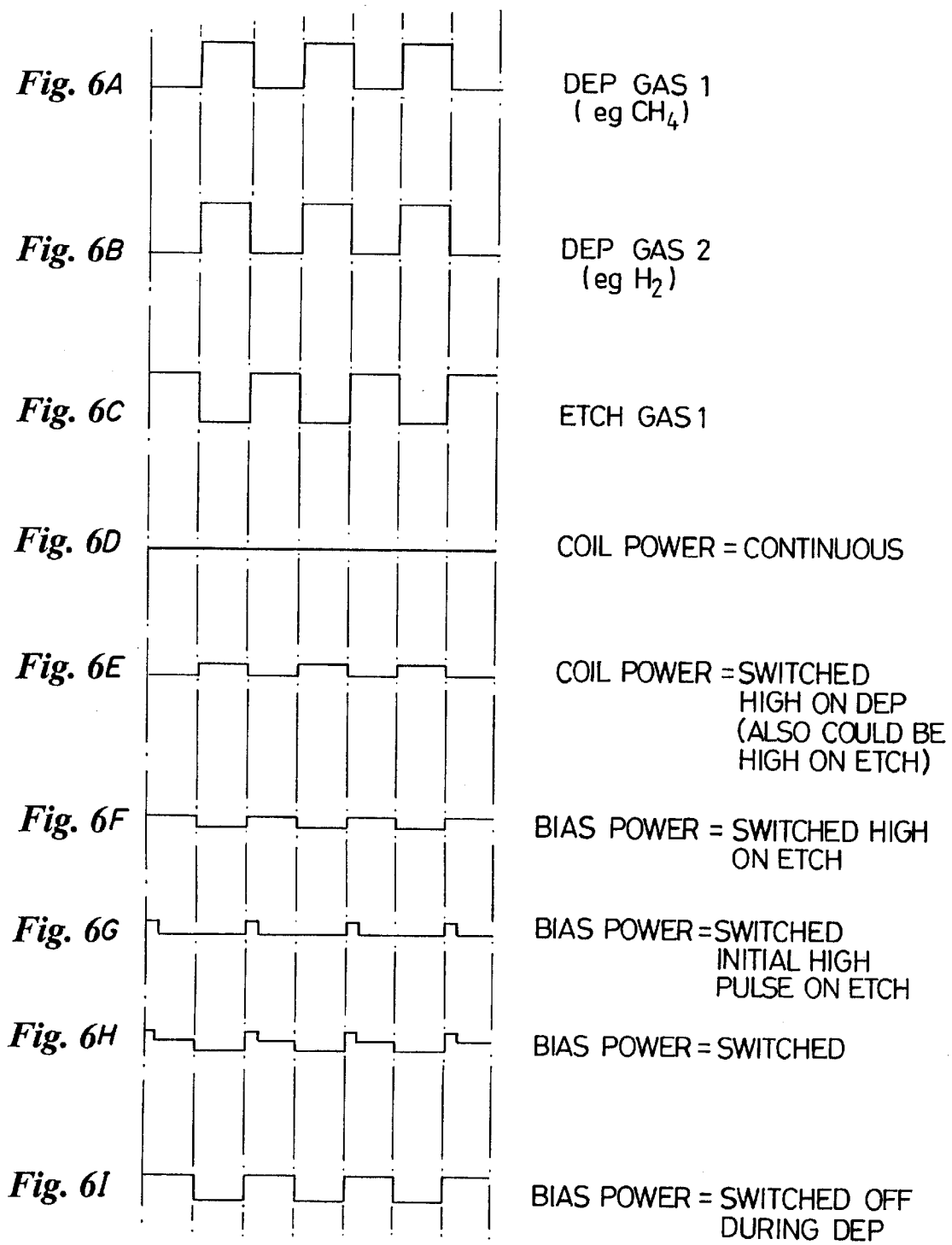
FIGS. 6A–6I are diagrams illustrating various possible synchronisations between gases and operating parameters of the FIG. 1 apparatus.
Figure 7:
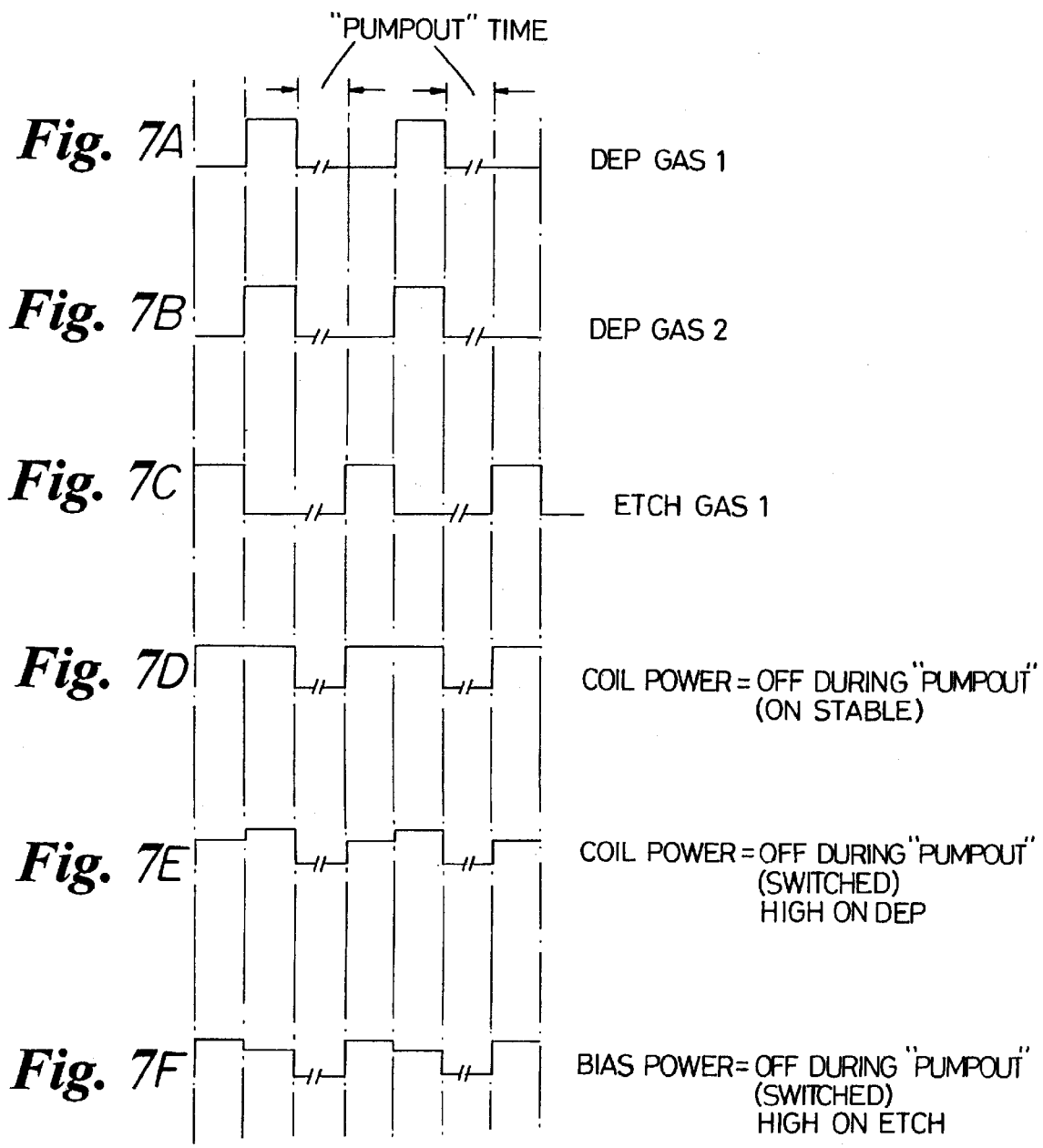
FIGS. 7A–7F are diagrams corresponding to FIGS. 6A–6I, but illustrating an alternative operating scenario.

FIGS. 6A–6I illustrate how various parameters of the process may be synchronized. FIG. 6D shows continuous and unchanging coil power, whilst FIG. 6E correspondingly shows that the coil power is switched to enhance the etch or deposition step and the power during etch may be different to that selected for deposition depending on the process performance required. FIG. 6E, by way of example, illustrates a higher coil power during deposition.

FIGS. 6F to 6I show similar variations in bias power. FIG. 6F shows a high bias power during etch to allow ease of removal of the passivation film, whilst 6G illustrates the use of an initial higher power pulse to enhance this removal process, whilst maintaining the mean ion energy lower, with resultant selectivity benefits. FIG. 6H is a combination of FIGS. 6F and 6G for situations where situations where higher ion energies are required during etching (eg. with deep trenches). FIG. 6I simply shows that bias may be off during deposition.

In some processes, at least, the acceptable segregation period of the gases is determined by the residual partial pressure of gas A (Ppa) which can be tolerated in the partial pressure of gas B(Ppb). This minimum value of Ppa in Ppb is established from the characteristic process rate (etch or deposition) as a function of Ppa/(Ppa+Ppb).

Figure 8:
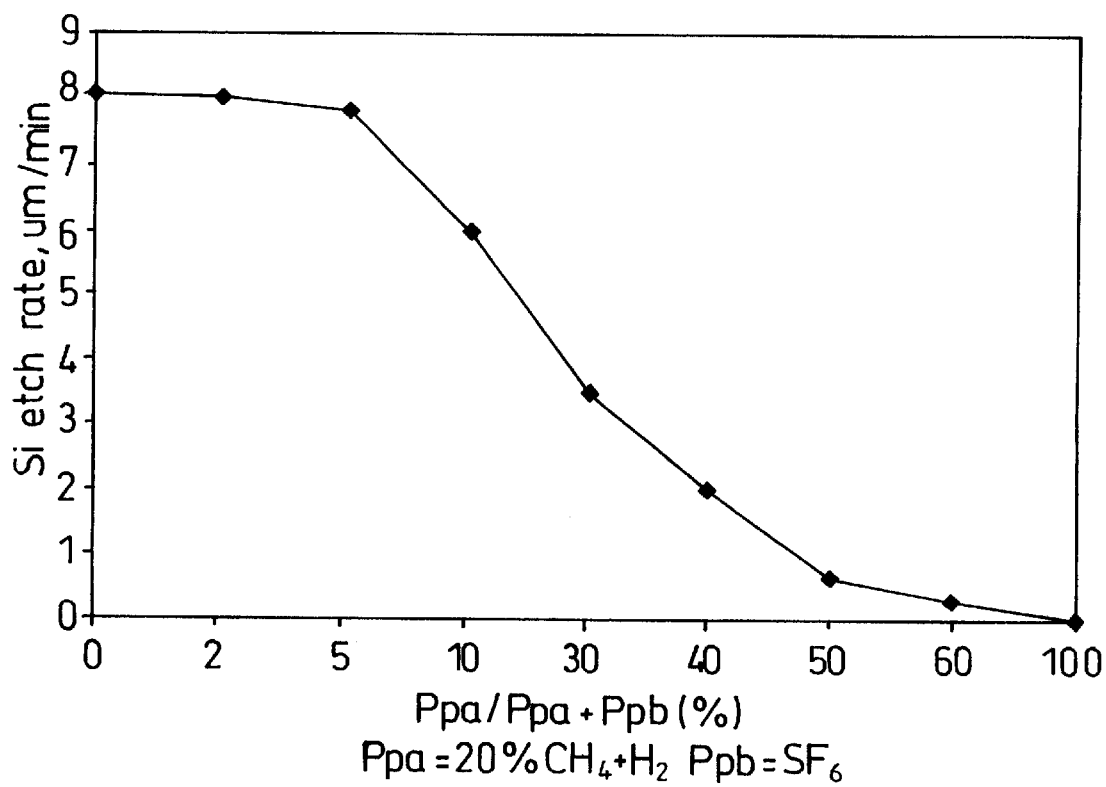
FIG. 8 is a plot of the etch rate of silicon against a partial pressure ratio.

In FIG. 8, Gas A is 20% $CH_4+H_2$, whilst gas B is $SF_6$. It will seen that where Ppa/(Ppa+Ppb)<5%, the process rate is substantially steady state. For typical practical conditions a pump out time of less than 1.5 seconds will suffice and a plasma can be maintained for over 65% of the total cycle time where the process steps are of the order of 2 to 3 secs and over 80% when the steps are over 5 seconds long. A suitable synchronization arrangement is shown in FIGS. 7A–7F. It will be noted that the etch precedes the pump out as it is desirable to prevent a mixing of the deposition and etch step gases. Prior art proposals (eg. U.S. Pat. No. 4,985,114) propose switching off or reducing deposition gas flow for a long period before the plasma is switched on. This can mean that the plasma power is on only for a small portion of the total cycle times leading to a significant reduction in etch rate. The Applicants propose that the chamber should be pumped out between at least some of the gas changeovers, but care must be taken to maintain pressure and gas flow stabilization. Preferably, high response speed mass flow controllers (rise times less than 100 ms) and automatic pressure controllers (angle change and stabilise in less than 300 ms) are used.

The Applicants have established (see FIG. 8) that the pump out time period necessary to avoid the etch being compromised by the deposition gases. However pump out could precede the etch steps or both etch and deposition step depending on the precise process being run. Pump out also reduces micro-loading (which is described in U.S. Pat. No. 4,985,114) and is beneficial for high aspect ratio etching as described below.

Figure 9A:
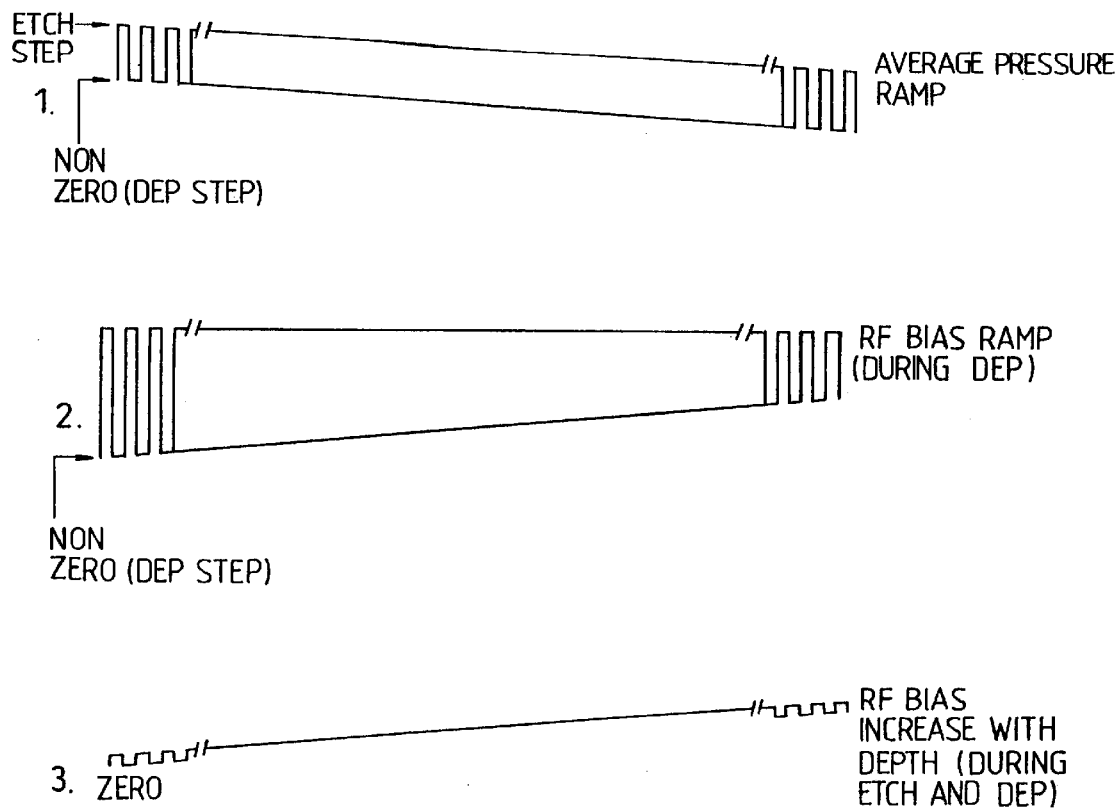
FIG. 9(A) is a schematic representation of parameter ramping for deep anisotropic profile control whilst 9(B) illustrates ramping more generally.
Figure 9B:
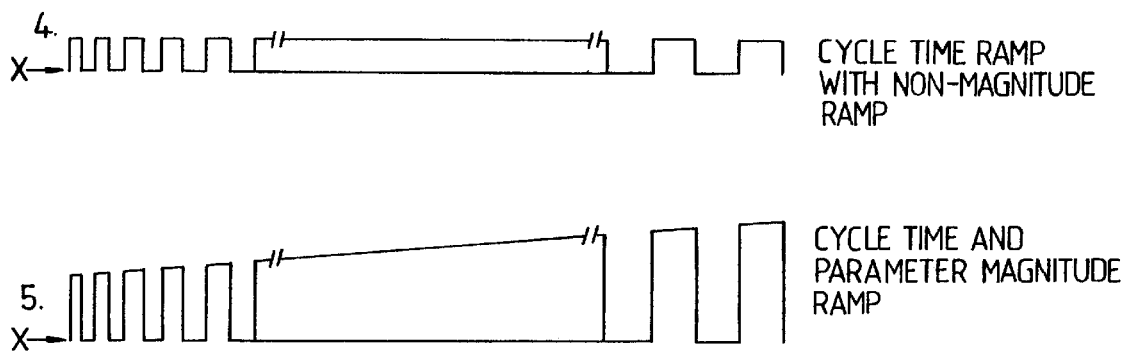

Many of the parameters, which are varied can be 'ramped' as generally illustrated in FIG. 9(B). This means that they progressively increase or decrease cycle by cycle in amplitude or period, rather than changing abruptly between cycles. In the case of the pump out, ramping can be used to allow mixing at the start of the process allowing sidewall notching to be reduced or eliminated as discussed below.

Typical process parameters are as follows:
1. Deposition Step
    $CH_4$ step time: 2–15 seconds; 4–6 seconds preferred
    $H_2$ step time: 2–15 seconds; 4–6 seconds preferred
    Coil rf power: 600W–1 kW; 800W preferred
    Bias rf power: High mean in energy case: 500W–300W–100W preferred
        Low mean in energy case: 0W–30W–10W preferred
    Pressure: 2 mTorr–50 mTorr; 20 mTorr preferred
2. Etch Step
    $SF_6$ step time: 2–15 seconds; 4–6 seconds preferred
    Coil rf power: 600W–1 kW–800W preferred
    Bias rf power: High mean ion energy case: 50W–300W; 150W preferred
        Low mean ion energy case: 0W–30W;15W preferred
    Pressure: 2 mTorr–50 mTorr; 30 mTorr preferred.
2. Etch/Deposition Relationship The Applicants have determined that the prior art approaches are essentially too simplistic, because they neither allow for changing conditions during a particular process nor for the different requirements or different types of formation. Further the prior art does not address the difficulties of deep etching.

Thus contrary to the teaching of WO-A-94114187 the Applicants believe that it will often be beneficial to overlap the etch and passivation or deposition steps so that the surface wall roughness indicated in FIG. 2 can be significantly reduced. The Applicants have also established that surprisingly the rigid sequential square wave stepping which has previously been used is far from ideal. In many instances, it will be desirable to use smooth transitions between the stages, particularly where overlap occurs, when reduction of the etch rate is acceptable. Thus one preferred arrangement is for the gas flow rates of the etch and deposition gases to vary with time in a sinusoidal manner the two "wave forms" being out of phase, preferably by close to 90°. As the sidewall roughness is essentially a manifestation of the enhanced lateral etch component, it can be reduced by limiting this component of the etch. The desired effect can be obtained in one of a number of ways: partially mixing the passivation and etch steps (overlapping); minimising the etch (and hence corresponding passivation) duration; reducing the etch product volatility by reducing the wafer temperature; adding passivation component to the etch gas e.g. $SF_6$ with added O, N, C, $CF_x$, $CH_x$, or replacing the etch gas with one of lower reactive species liberating gas such as $SF_6$ replaced by $CF_x$ etc.

The Applicants have also appreciated that changes in the levels of etching and deposition are desirable at different stages within the process. The Applicants propose that the first cycle or the first few cycles should have an enhanced deposition by increasing the period of deposition, the deposition rate, or any other suitable means. Equally or alternatively the etch rate or time can be reduced.

As has briefly been indicated before, it also can become progressively more difficult to deposit material as the formation or trench gets deeper and/or the aspect ratio increases. By controlling the amplitude of one or more of the gas flow rates, chamber pressure, plasma power, biasing power, cycle time, substrate etching/deposition ratio, the system can be tuned in an appropriate manner to achieve good anisotropic etching with proper sidewall passivation.

These and related techniques can be utilised to overcome a number of problems in the etch profile:
    a. Sidewall Notching The 'sidewall notching' problem is particularly sensitive to the exposed silicon area (worse at low exposed areas <30%) and is also correspondingly worse at high silicon mean etch rates. The Applicants believe such notching to be caused by a relatively high concentration of etch species, during the initial etch/deposition cycles. Therefore the solutions adopted by the Applicants are to either enhance the passivation or quench etch species during the first cycles. The latter can be achieved either by process adjustment (ramping one of more of the parameters) or by placing a material within the reactor which will consume (by chemical reaction) the etch species, such as Si, Ti, W etc. reacting with the F etchant. Such chemical loading has the drawback of reducing the mean etch rate, as the quenching is only necessary for the first few etch steps. Thus, process adjustment solutions are considered superior.

It is desirable to reduce/eliminate the sidewall notching without compromising or degrading any of the other aspects of the etch, such as etch rate, profile control, selectivity etc. Investigations by the Applicants have shown the approach of 'reducing the etch species concentration at the start of etch' is best controlled by beginning a process with:
    a. fluorine scavenging gas introduction or
    b. low coil power or
    c. low etch cycle time (step duration) or
    d. low etch gas flow or
    e. an increase of the corresponding parameters a to d above during the passivation cycle or
    f. a combination of the above,
followed by increasing the respective parameter(s) to normal pre-optimised etch conditions such as are illustrated in FIGS. 6A–6I. The increase can either be abrupt (that is using, for example, a step change in the a to f parameters) or ramped. The results of these two approaches are now presented, in comparison to the teachings of the prior art.

Figure 3:
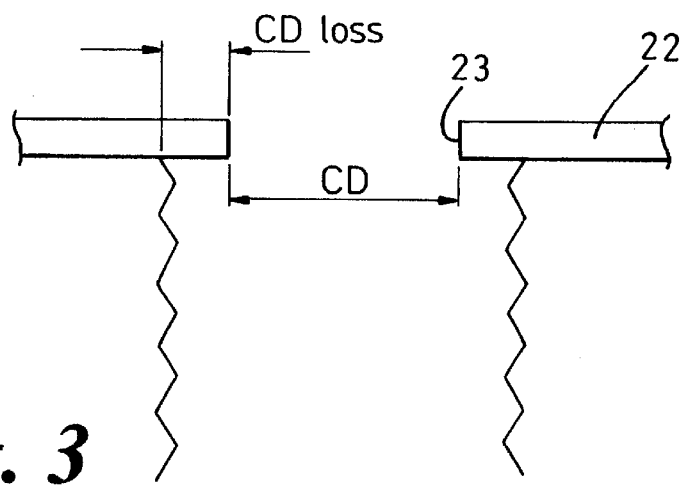
FIG. 3 is an enlarged view of the mouth of the trench shown in FIG. 2.
Figure 10:
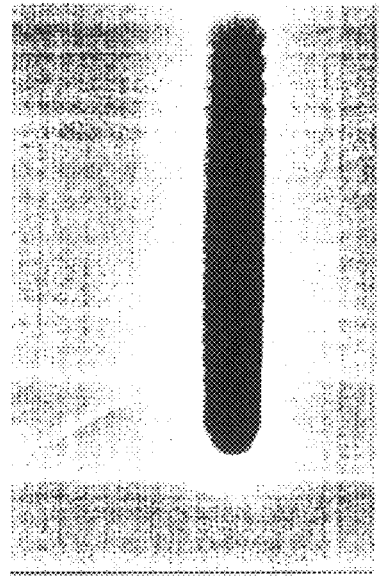
FIGS. 10 and 11 are SEM's of a trench formed in accordance with the prior art, FIG. 11 being an enlargement of the mouth of FIG. 10.
Figure 11:
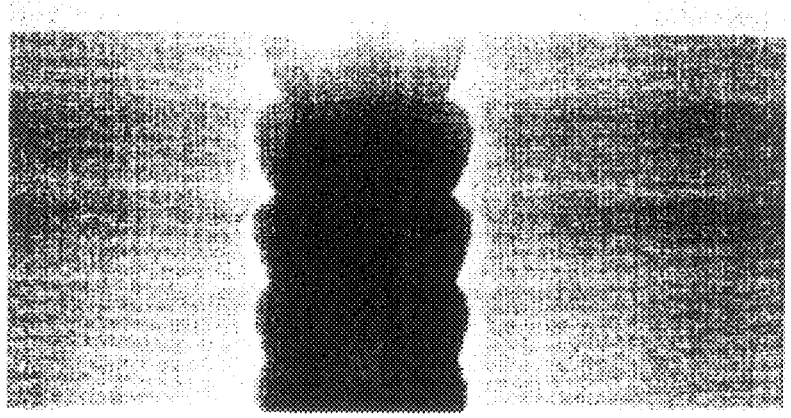

The nature of the problem (resulting from directly applying the prior art) during a silicon trench etch is shown in FIG. 3 schematically and in the SEM's (scanning electron micrographs) shown in FIG. 10 and 11. These Figures show that for a 1.7 $\mu$m initial trench opening the CD loss is 1.2 $\mu$m (70%), whilst the notch width is up to 0.37 $\mu$m. Such values of CD loss are unacceptable for the majority of applications.

Figure 12:
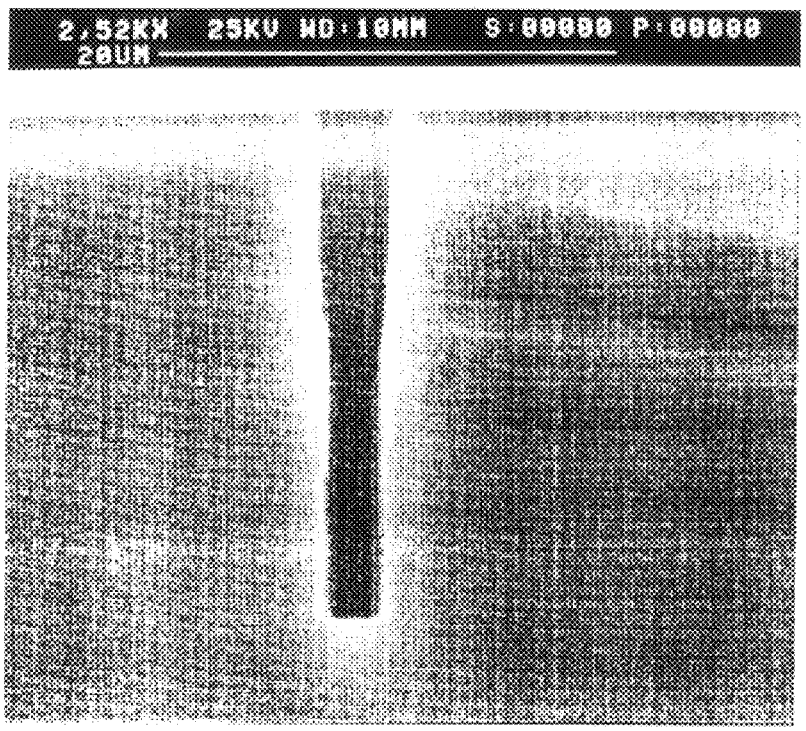
FIGS. 12 and 13 are corresponding SEM's for a trench formed by the Applicants' process in which an abrupt transition in process parameters has occurred.
Figure 13:
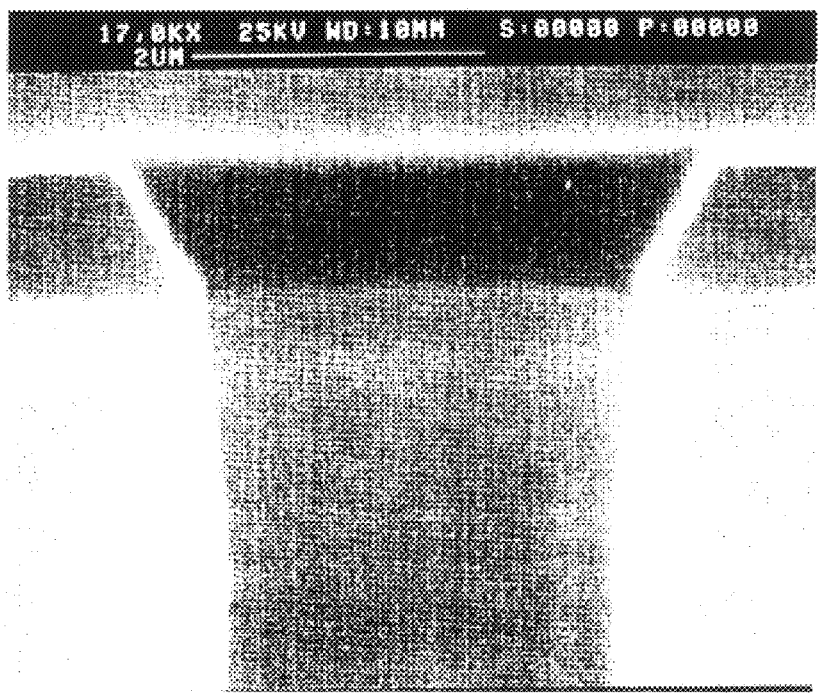

However by using the Applicants method (as in FIGS. 6A–6F) of varying the process parameters during the initial cyclic etch process, the notched sidewall can be modified. If abrupt steps are used to vary the process parameters, abrupt transitions are produced in the sidewall profiles. The SEMs in FIGS. 12 and 13 illustrate this for different process parameters. In FIG. 12, the transition in the process parameters is clearly marked as an abrupt transition in the sidewall profile at the point of parameter change (after 8.5 µm etch depth). (Note that the sidewall notches have been eliminated.) FIG. 13 illustrates yet another process parameter abrupt/step change. Here the sidewall passivation is high enough to result in a positive profile (and no notching) for the first 2 µm. When the reduced passivation conditions are applied, it is characterized by the transition in sidewall angle and reappearance of the notching.

Figure 14:
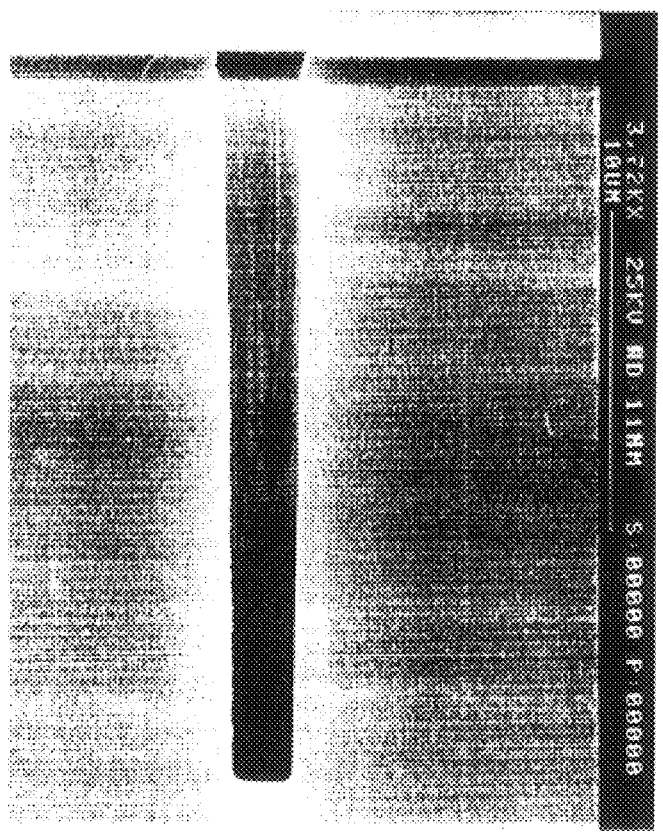
FIG. 14 corresponds to FIG. 12 except ramped parameters have been utilised.

By using the 'ramped' parameter approach, the notching can be eliminated, as well as producing a smooth sidewall profile without any abrupt transition, see the SEM in FIG. 14. This shows a 22 µm deep trench etch, with a smooth positive profile and no CD loss, whilst maintaining etch rate comparable to the non-ramped high underact process. The process conditions used in this case are given in FIG. 19a.

b. Profile control during deep high aspect ratio etching

The teachings of the prior art are limited where high aspect ratio (>10:1) etching is required. Whilst the limitations and solutions are discussed here for relatively deep etching (>200 µm), there is equal relevance for shallow high aspect ratio etching, even for very low values of CD, such as <0.5 µm.

Figure 15:
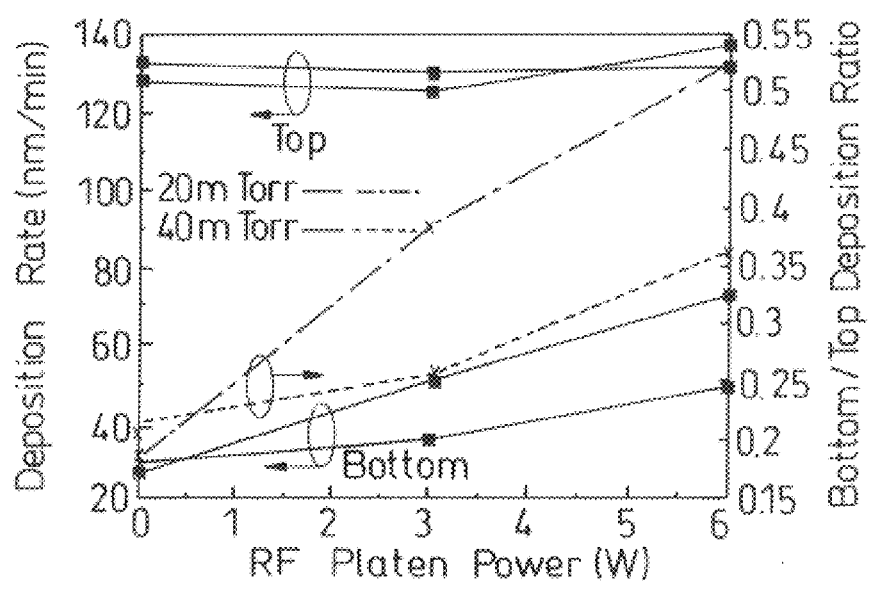
FIG. 15 is a plot of deposition rate against RF Platen Power at a variety of chamber pressures.

One of the basic mechanisms, that distinguishes high aspect ratio etching, is the diffusion of the etching (and passivation) reactive precursors as well as etch products. This species transport phenomenon was investigated for the passivation step. The results show clearly that the transport of sidewall passivation species to the base of deep trenches is improved at low pressure. Increasing platen power also improves this, (see FIG. 15). The graph illustrates the improved passivation towards the base of the trench as the pressure decreases and the rf bias power increases. This data was obtained by first etching 200 µm deep trenches, then using the passivation step only and measuring the variation of sidewall passivation with depth using an SEM. This supports the variation of passivation with etch depth, and further supports the suggestion that the optimum process conditions vary with etch depth.

Figure 16:
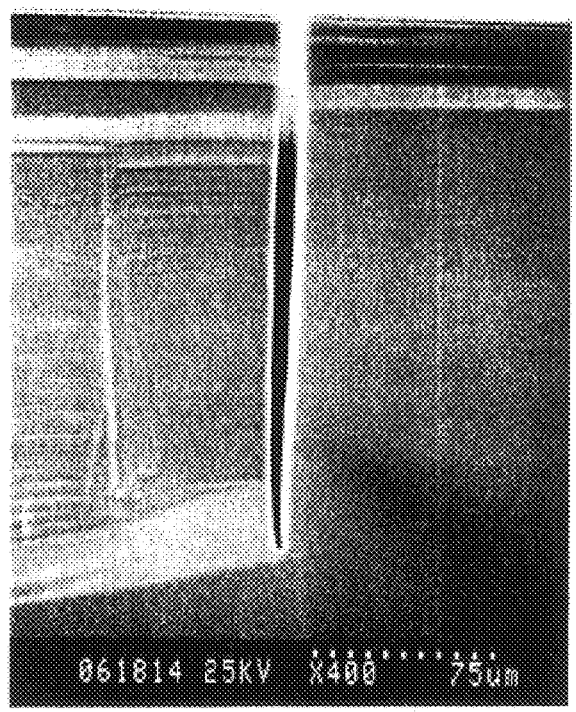
FIG. 16 is a SEM of a prior art high aspect ratio trench.
Figure 17:
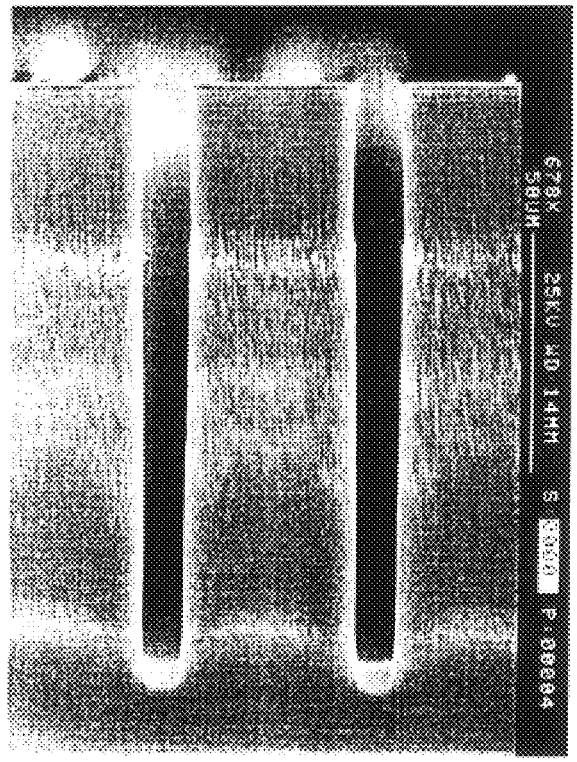
FIG. 17 is a corresponding SEM using the Applicants' process with abrupt transitions.
Figure 18:
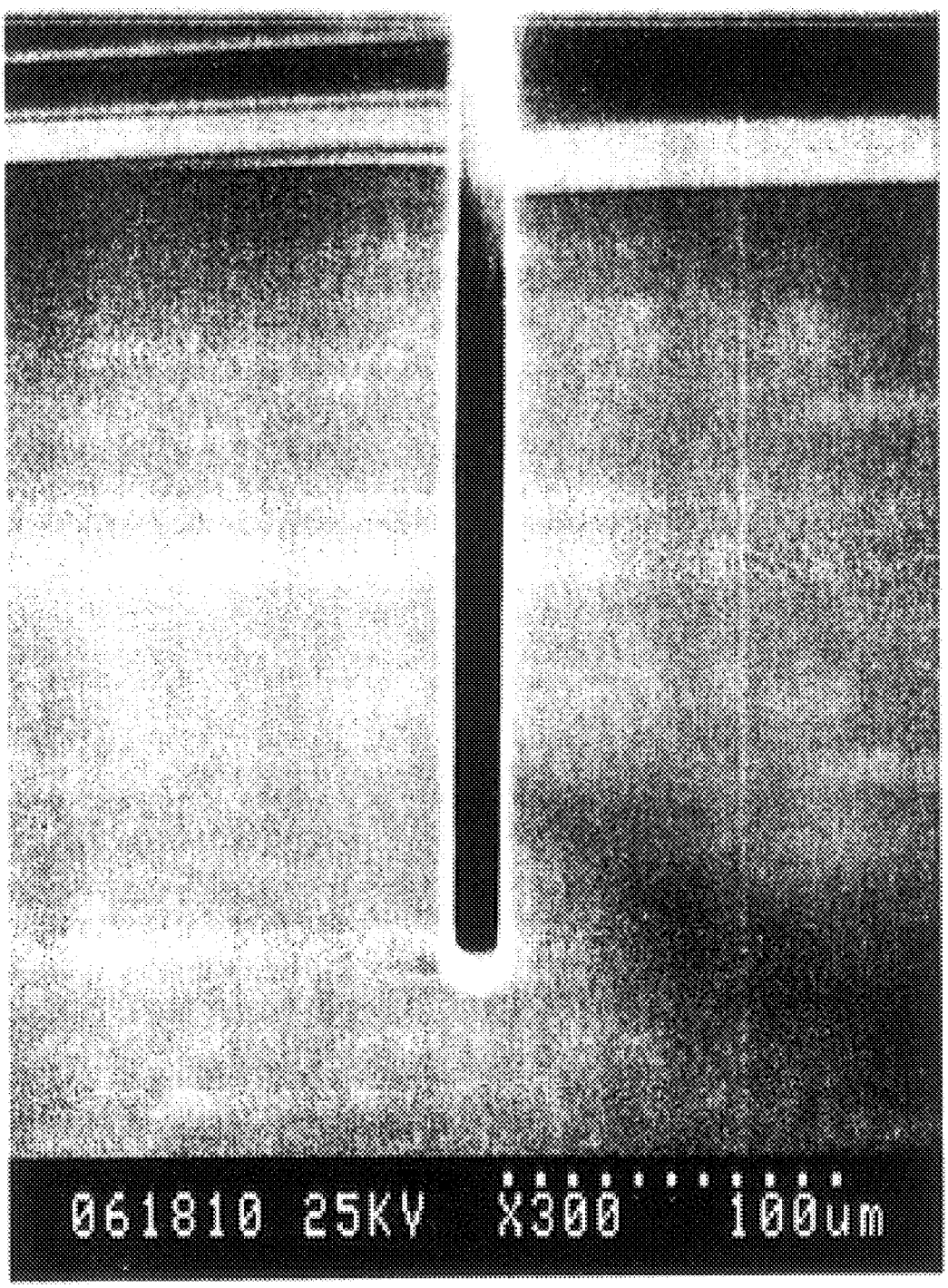
FIG. 18 is a SEM of a high aspect ratio trench formed by the Applicants' process whilst using ramped transitions.

The limitations of applying the prior art for such a high aspect ratio process is shown by the SEM in FIG. 16. It should be noted that this relatively high passivation to etch ratio fixed parameter process still does result in initial sidewall notching, but the SEM magnification is not sufficiently high to show this for the 10 µm CD, 230 µm deep trench etch. From the trends shown in FIG. 15, the profile can be somewhat improved by operating at under the desired high bias rf power and low pressure conditions. However as a fixed parameter process, the high bias and low pressure conditions significantly degrades the mask selectivity (from >100:1 to <20:1) as the ion energy is increased. Using an abrupt parameter variation results in a corresponding abrupt sidewall change, as shown by the SEM in FIG. 17. Ramping the following parameters: increasing platen power, decreasing pressure, increasing cycle times and gas flows; does produce the desired results whilst maintaining reasonably high selectivities >75:1, see FIG. 18. Here the SEM shows a 295 µm deep, 12 µm CD trench etch (25:1 aspect ratio). The process conditions used in this case are given in FIG. 19B.

FIG. 20 illustrates a synchronization between deposition and etch gases which have been used for the initial cycles to reduce side wall notching. Typical operating conditions are given in FIG. 19A and its associated SEM in FIG. 14. FIG. 21 illustrates a synchronisation reference to using a scavenger gas with method (a) of side wall notch reduction technique. The dotted line indicates the alternative of the scavenger gas flow rate being decreasingly ramped.

FIG. 9A shows a synchronization for achieving a deep high aspect ratio anisotropic etch although the ramping technique shown can also be used for side wall notch reduction. The conditions of FIG. 19B can be used to achieve the results shown in FIG. 18.

Returning to FIG. 9A:

1. Shows an average pressure ramp. Note the pressure changes from low to high as the cycle changes from deposition to etch respectively. The ramp down of pressure then results in the pressure decreasing for both etch and passivation cycles.

2. This shows a rf bias power ramp. Note the bias change from low to high as the cycle changes from deposition to etch respectively. This is in synchronization with the pressure change discussed above. The ramp up of bias refers to the deposition step only in this case.

3. This shows another example of a rf bias power ramp. Again the bias changes from low to high as the cycle changes from deposition to etch respectively, in synchronization to the pressure. The ramp up of bias refers to both the deposition step and etch step in this case.

In FIG. 9B general parameter ramping is illustrated. These examples serve to illustrate cycle time and step time ramping respectively.

4. This shows a cycle time ramp, where the magnitude of the parameter (such as gas flow rates, pressure, rf powers, etc) is not ramped. In some applications this would serve as an alternative to the 'magnitude' ramping in the above cases.

5. This shows a cycle time ramp, where the magnitude of the parameter (such as gas flow rates, pressure, rf powers, etc.) is ramped in addition. Note, the parameter ramp may be increasing or decreasing in magnitude, and the decrease may be to either zero or a non-zero value.

3. Etch Gases

Whilst any suitable etch gases may be used, the Applicants have found that certain gases or mixture can be beneficial.

Thus, it has been suggested in WO-A-94114187 that it is undesirable to have any passivating gas in the etch stage, because it affects the process rate. However, the Applicants have determined, that this procedure can significantly improve the quality of the sidewall trenches formed and it is proposed that the etched gas may have added to it such passivating gases as O,N,C, hydrocarbons, hydro-halo carbons and/or halo-carbons. Equally, and for the same purpose, it is desirable to reduce the chemical reactivity of the etched gas and the Applicants propose using $CF_x$ for example with higher atomic mass halides such as Cl, Br or I. However $XeF_2$ and other etch gases may be used.

The degree of sidewall roughness can also alternatively be reduced by limiting the cycle times. For example it has been discovered that it is desirable to limit the etch and deposition periods to less than 7.5 seconds and preferably less than 5 seconds.

4. Gallium Arsenide and other Materials

Previous proposals have all related to trench formation in silicon. The Applicants have appreciated that by using suitable passivation, anisotropic etching of Gallium Arsenide and indeed, other etchable material, can be achieved. For example it is proposed that Gallium Arsenide be etched with $Cl_2$ with or without passivating or etch enhancing gases, but in general it has been determined that this technique is much more successful with the carbon or hydro carbon passivation proposed above. If traditional $CF_x$ chemistry is used etch inhibiting compounds can be created which increase surface roughness or limit the etch. For Gallium Arsenide lower temperatures may be desirable as may be the use of a low pressure, high plasma density reactor. Suitable etch chemistries have already been listed in the preamble to this specification.

What is claimed is:

1. A method of etching a trench in a semiconductor substrate, including repeatedly and alternately (a) etching the semiconductor substrate and (b) depositing a passivation layer on the semiconductor substrate, wherein said (b) depositing the passivation layer on the semiconductor substrate comprises:

placing the substrate in a vacuum chamber;

inducing a plasma in the vacuum chamber such that ions of the plasma are accelerated at a given mean ion energy onto the substrate;

introducing a hydrocarbon deposition gas to deposit a hydrocarbon polymeric film;

introducing $H_2$ with the hydrocarbon deposition gas to simultaneously etch the substrate while the hydrocarbon deposition gas deposits the film;

maintaining a mixture percentage of the hydrocarbon deposition gas in the $H_2$ between a first percentage and a second percentage while the hydrocarbon deposition gas deposits the film;

wherein said first percentage of the hydrocarbon deposition gas in the $H_2$ is a percentage at which an etch rate for the substrate peaks;

wherein said second percentage of the hydrocarbon deposition gas in the $H_2$ is one of a lower percentage and an upper percentage, wherein said lower percentage is a percentage of the hydrocarbon deposition gas in the $H_2$ at which said etch rate begins to rise from a generally steady state, wherein said upper percentage is a percentage of the hydrocarbon deposition gas in the $H_2$ at which said etch rate falls to zero, and wherein said first percentage is between said upper and lower percentages.

2. A method as claimed in claim 1, wherein the mean ion energy is greater than 100 eV and wherein the second percentage is the lower percentage.

3. A method as claimed in claim 2, wherein the hydrocarbon gas is at least one selected from a group consisting of $CH_4$, $C_2H_4$, $C_3H_6$, $C_4H_8$ or $C_2H_2$.

4. A method as claimed in claim 1, wherein the given mean ion energy is less than 30 eV and wherein the second percentage is the upper percentage.

5. A method as claimed in claim 4, wherein the hydrocarbon gas is at least one selected from a group consisting of $CH_4$, $C_2H_4$, $C_3H_6$, $C_4H_8$ or $C_2H_2$.

6. A method as claimed in claim 1, wherein the hydrocarbon gas is at least one selected from a group consisting of $CH_4$, $C_2H_4$, $C_3H_6$, $C_4H_8$ or $C_2H_2$.

7. A method of etching a trench in a semiconductor substrate, including alternately (a) etching the semiconductor substrate and (b) depositing a passivation layer on the semiconductor substrate in each of a plurality sequential process cycles, wherein at least one process parameter of said plurality of process cycles periodically varies with time, said at least one process parameter being selected from a group consisting of gas flow rate, chamber pressure, plasma power, substrate bias, etch rate, deposition rate cycle times and etching/deposition ratio; and wherein said (b) depositing the passivation layer on the semiconductor substrate of each process cycle comprises:

placing the substrate in a vacuum chamber;

inducing a plasma in the vacuum chamber such that ions of the plasma are accelerated at a given mean ion energy onto the substrate;

introducing a hydrocarbon deposition gas to deposit a hydrocarbon polymeric film;

introducing $H_2$ with the hydrocarbon deposition gas to simultaneously etch the substrate while the hydrocarbon deposition gas deposits the film;

maintaining a mixture percentage of the hydrocarbon deposition gas in the $H_2$ between a first percentage and a second percentage while the hydrocarbon deposition gas deposits the film;

wherein said first percentage of the hydrocarbon deposition gas in the $H_2$ is a percentage at which an etch rate for the substrate peaks;

wherein said second percentage of the hydrocarbon deposition gas in the $H_2$ is one of a lower percentage and an upper percentage, wherein said lower percentage is a percentage of the hydrocarbon deposition gas in the $H_2$ at which said etch rate begins to rise from a generally steady state, wherein said upper percentage is a percentage of the hydrocarbon deposition gas in the $H_2$ at which said etch rate falls to zero, and wherein said first percentage is between said upper and lower percentages.

8. A method as claimed in claim 7, wherein the mean ion energy is greater than 100 eV and wherein the second percentage is the lower percentage.

9. A method as claimed in claim 8, wherein the hydrocarbon gas is at least one selected from a group consisting of $CH_4$, $C_2H_4$, $C_3H_6$, $C_4H_8$ or $C_2H_2$.

10. A method as claimed in claim 7, wherein the given mean ion energy is less than 30 eV and wherein the second percentage is the upper percentage.

11. A method as claimed in claim 10, wherein the hydrocarbon gas is at least one selected from a group consisting of $CH_4$, $C_2H_4$, $C_3H_6$, $C_4H_8$ or $C_2H_2$.

12. A method as claimed in claim 7, wherein the hydrocarbon gas is at least one selected from a group consisting of $CH_4$, $C_2H_4$, $C_3H_6$, $C_4H_8$ or $C_2H_2$.

13. A method as claimed in claim 7, wherein said at least one process parameter is variable within a process cycle.

14. A method as claimed in claim 7, wherein said at least one process parameter is variable from one process cycle to a next process cycle.

15. A method as claimed in claim 7, wherein the variation of said at least one process parameter is a ramped variation.

16. A method as claimed in claim 7, wherein an etch rate is reduced during at least a first process cycle.

17. A method as claimed in claim 7, including depositing a mask having openings prior to etching.

18. A method as claimed in claim 17, wherein at least a portion of a mask is formed by the depositing of the passivation layer.

19. A method as claimed in claim 7, wherein said etching and depositing each occur for a period of less than 7.5 seconds within each process cycle.

20. A method of etching as claimed in claim 7, wherein the (a) etching and (b) depositing of each process cycle overlap in time.

21. A method of etching as claimed in claim 7, wherein a chamber pressure is reduced during the (b) depositing of each process cycle.

22. A method of etching as claimed in claim 7, wherein the substrate is maintained between −100° C. and 100° C.

23. A method as claimed in claim 7, including pumping out the chamber between the (a) etching and (b) depositing of each process cycle, wherein the pumping out continues until:

$$\frac{Ppa}{Ppa + Ppb} \leq x$$

wherein Ppa is a partial pressure of a gas (A) used in a preceding step, wherein Ppb is a partial pressure of a gas (B) to be used in a subsequent step, and wherein x is a percentage at which a process rate of the process associated with gas (A) drops off from an essentially steady state.

* * * * *